United States Patent [19]

Aronowitz et al.

[11] Patent Number: 5,707,888

[45] Date of Patent: Jan. 13, 1998

[54] OXIDE FORMED IN SEMICONDUCTOR SUBSTRATE BY IMPLANTATION OF SUBSTRATE WITH A NOBLE GAS PRIOR TO OXIDATION

[75] Inventors: Sheldon Aronowitz; James Kimball, both of San Jose, Calif.

[73] Assignee: LSI Logic Corporation, Milpitas, Calif.

[21] Appl. No.: 434,674

[22] Filed: May 4, 1995

[51] Int. Cl.$^6$ .................................................. H01L 21/76
[52] U.S. Cl. .............................. 437/69; 437/24; 437/25; 437/26; 437/70
[58] Field of Search .............................. 437/69, 70, 24, 437/25, 26; 148/DIG. 116

[56] References Cited

U.S. PATENT DOCUMENTS

| 4,016,017 | 4/1977 | Aboaf et al. | 148/187 |
|---|---|---|---|
| 4,748,134 | 5/1988 | Holland et al. | 437/62 |
| 5,134,089 | 7/1992 | Barden et al. | 437/69 |
| 5,151,381 | 9/1992 | Liu et al. | 437/69 |

FOREIGN PATENT DOCUMENTS

| 0083465 | 7/1978 | Japan | 437/69 |
|---|---|---|---|
| 0042987 | 4/1979 | Japan | 437/70 |
| 0084436 | 5/1984 | Japan | 437/69 |
| 0101947 | 6/1985 | Japan | . |
| 0051843 | 3/1986 | Japan | . |
| 0122156 | 5/1988 | Japan | . |
| 0280438 | 11/1988 | Japan | . |
| 0000744 | 1/1989 | Japan | 437/24 |

OTHER PUBLICATIONS

Sze, S.M., *VLSI Technology*, New York: McGraw-Hill Book Company, 1983, pp. 31 and 48.

*Primary Examiner*—Trung Dang
*Attorney, Agent, or Firm*—John P. Taylor

[57] ABSTRACT

A process and resulting product is described for forming an oxide in a semiconductor substrate which comprises initially implanting the substrate with atoms of a noble gas, then oxidizing the implanted substrate at a reduced temperature, e.g., less than 900° C., to form oxide in the implanted region of the substrate, and then etching the oxidized substrate to remove a portion of the oxide. The resulting oxidation produces a dual layer of oxide in the substrate. The upper layer is an extremely porous and frothy layer of oxide, while the lower layer is a more dense oxide. The upper porous layer of oxide can be selectively removed from the substrate by a mild etch, leaving the more dense oxide layer in the substrate. Further oxide can then be formed adjacent the dense layer of oxide in the substrate, either by oxide deposition over the dense oxide or by growing further oxide beneath the dense oxide layer. The initial oxide formed by the process appears to be temperature independent, at temperatures of 900° C. or less, with oxide formation apparently dependent upon the extent of the implanted regions of the substrate, rather than upon temperature, resulting in thermal savings. Furthermore, the excess implanted noble gas in the substrate adjacent the oxide formed therein can have beneficial effects in inhibiting the formation of parasitic field transistors and in greater control over field thresholds.

24 Claims, 4 Drawing Sheets

OXIDE FORMED IN SEMICONDUCTOR SUBSTRATE BY IMPLANTATION OF SUBSTRATE WITH A NOBLE GAS PRIOR TO OXIDATION

BACKGROUND OF THE INVENTION

1. Field of the Invention

This invention relates to the formation of integrated circuit structures. More particularly, this invention relates to the formation of oxide in a semiconductor substrate by implantation of the substrate with a noble gas prior to oxidation of the substrate.

2. Description of the Related Art

Oxide is usually formed in a semiconductor substrate for the purpose of providing electrical isolation between active and/or passive devices formed in the substrate such as, for example, the devices of a integrated circuit structure. Such isolation oxide is conventionally formed either as a field oxide grown in openings in a masked substrate; or by forming isolation trenches which are then at least partially filled with an isolation oxide, usually by oxidizing the walls of the trench.

Each of these two types of isolation oxide has problems associated with it. In the case of field oxide, oxidation of unmasked portions of the substrate usually also results in partially oxidation of adjacent portions of the substrate under the mask, resulting in the formation of bird's beaks. The presence of such oxide under the mask may possibly be due to migration of oxide at the over 900° C. temperatures conventionally used in the formation of field oxide by thermal growth. While such bird's beaks can serve as stress relief transition regions, they also reduce the lateral dimension of the active region defined by the mask. This problem has increased in magnitude with the reduction of device sizes, i.e., in the formation of VLSI integrated circuit structures.

The formation of isolation trenches provides for more accurate control of the lateral dimensions of the active region of the substrate between the trenches. However, formation of such trenches, and subsequent filling or partial filling of the trench with oxide, can result in the formation of stress-induced defects in the substrate itself.

It would, therefore, be desirable to form an oxide in a substrate, which could be used as an isolation oxide, while avoiding the problems of the prior art associated with such oxide formation in the substrate. It would be further desirable to be able to form oxide in a substrate at a reduced temperature, e.g., equal to or less than 900° C.

SUMMARY OF THE INVENTION

The invention provides a process and resulting product comprising an oxide formed in a semiconductor substrate by initially implanting the substrate with atoms of a noble gas, then oxidizing the implanted substrate at a reduced temperature, e.g., equal to or less than 900° C., to form oxide in the implanted region of the substrate, and then etching the oxidized substrate to remove a portion of the oxide. The oxidation step produces a dual layer of oxide in the substrate. The upper layer is an extremely porous and frothy layer of oxide, while the lower layer is a more dense oxide. The upper porous layer of oxide can be selectively removed from the substrate by a mild etch which leaves the more dense oxide layer in the substrate. Further oxide can then be grown or deposited over the dense layer of oxide in the substrate to form an oxide isolation region in the substrate.

The oxide formed by this process appears to be temperature independent, at temperatures of 900° C. or less, with oxide formation apparently dependent upon the extent of the implanted regions of the substrate, rather than upon temperature, resulting in thermal savings. Furthermore, the excess implanted noble gas in the substrate adjacent the oxide formed therein can have beneficial effects in reducing the possibility of latch-up and in offering greater control over field thresholds.

DETAILED DESCRIPTION OF THE INVENTION

General Description of the Process

The invention comprises a process for forming an oxide in a semiconductor substrate, as well as the resulting product. The oxide is formed by initially implanting the substrate with atoms of a noble gas, then oxidizing the implanted substrate at a reduced temperature, e.g., equal to or less than 900° C., to form oxide in the implanted region of the substrate, and then etching the oxidized substrate to remove a portion of the oxide. The oxidation step produces a dual layer of oxide in the substrate. In accordance with the invention, the upper layer is an extremely porous and frothy layer of oxide, while the lower layer is a more dense oxide. The upper porous layer of oxide can be selectively removed from the substrate by a mild etch which leaves the more dense oxide layer in the substrate. Further oxide can then be grown or deposited over the dense layer of oxide formed in the substrate.

Figure 1:
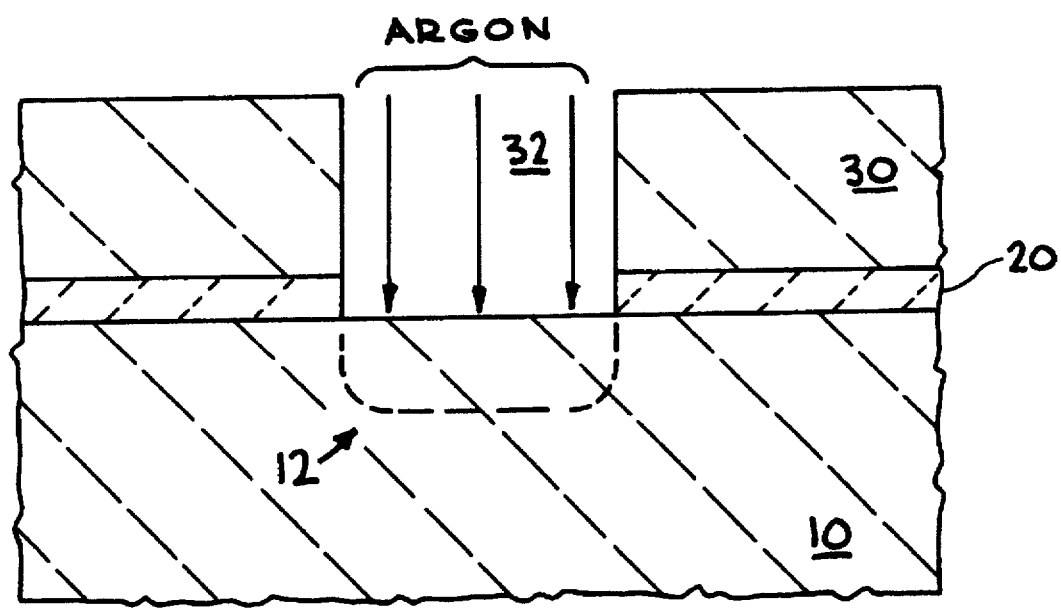
FIG. 1 is a fragmentary vertical cross-sectional view of a masked substrate being implanted with noble gas atoms.

Turning now to FIG. 1, a semiconductor substrate such as, for example, a silicon wafer, is shown at 10 having a thin oxide layer 20 formed thereon to facilitate the formation of a masking layer 30 over oxide layer 20, if a nitride mask is used. Mask layer 30, and underlying oxide layer 20 are shown as previously patterned to form an opening 32 to expose substrate 10. Region 12 of substrate 10 is shown being implanted with noble gas atoms through masking opening 32.

Figure 2:
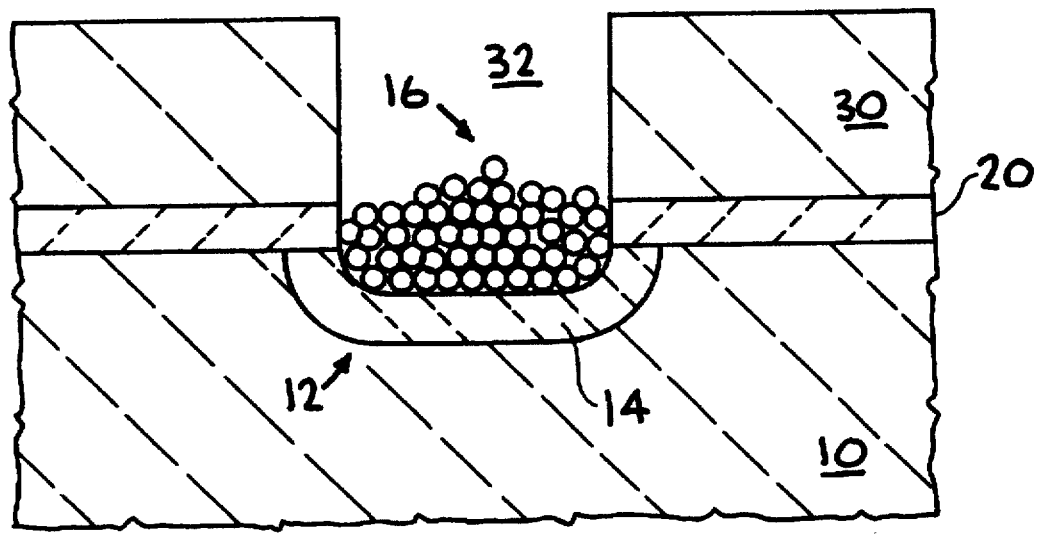
FIG. 2 is a fragmentary vertical cross-sectional view of the implanted substrate of FIG. 1 after being exposed to a wet atmosphere to form a dual layer of oxide in the implanted regions of the substrate.

Implanted substrate 10 is then subject to a wet oxidation to form, in implanted region 12, a first dense oxide portion 14 and a second, less dense, oxide portion 16 over dense oxide portion 14 by the wet oxidation step, as shown in FIG. 2. Oxide portion 16 comprises a porous oxide material having a frothy appearance.

Figure 3:
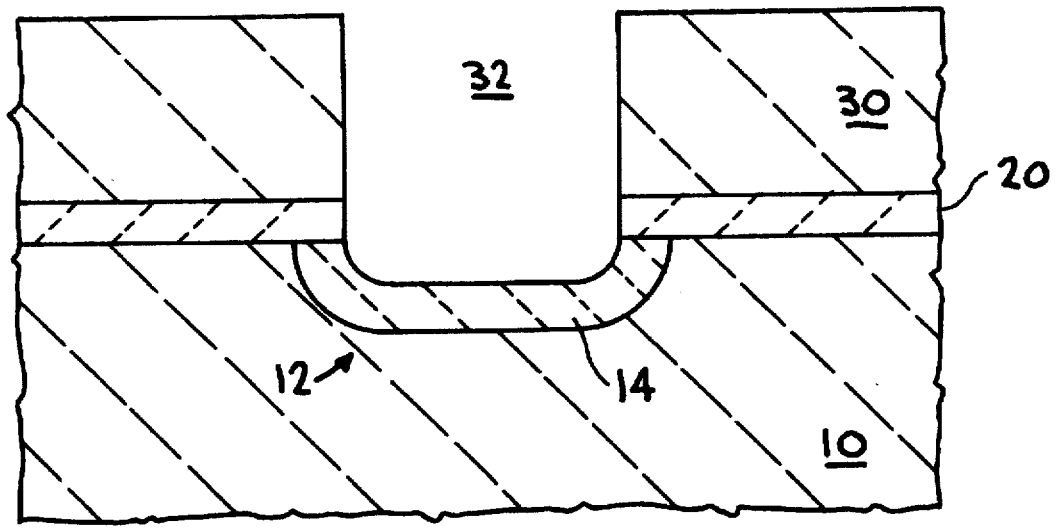
FIG. 3 is a fragmentary vertical cross-sectional view of the oxidized substrate of FIG. 2 after being exposed to an etch to remove the upper less dense layer of oxide.

Implanted and oxidized substrate 10 is then exposed to a mild etch to selectively remove the porous or frothy oxide portion 16, leaving only the more dense oxide portion 14 remaining in substrate 10, as shown in FIG. 3.

Figure 4:
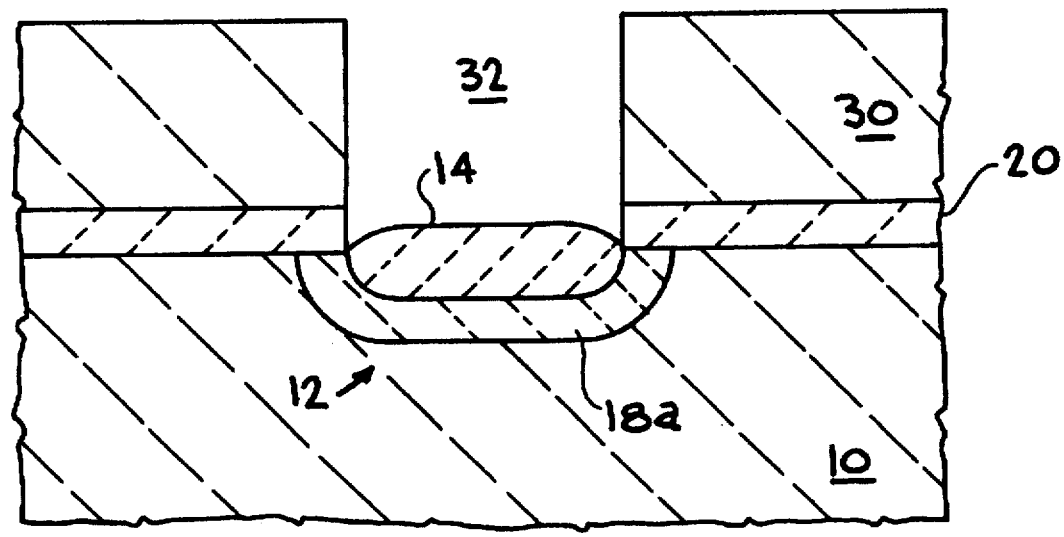
FIG. 4 is a fragmentary vertical cross-sectional view of the etched substrate of FIG. 3 after formation of further oxide grown over the dense oxide grown in the implanted region of the substrate.

Implanted oxidized, and etched substrate 10 may then be further oxidized by a further wet oxidation processing step to grow a further oxide portion 18a beneath dense oxide portion 14, as shown in FIG. 4.

Figure 5:
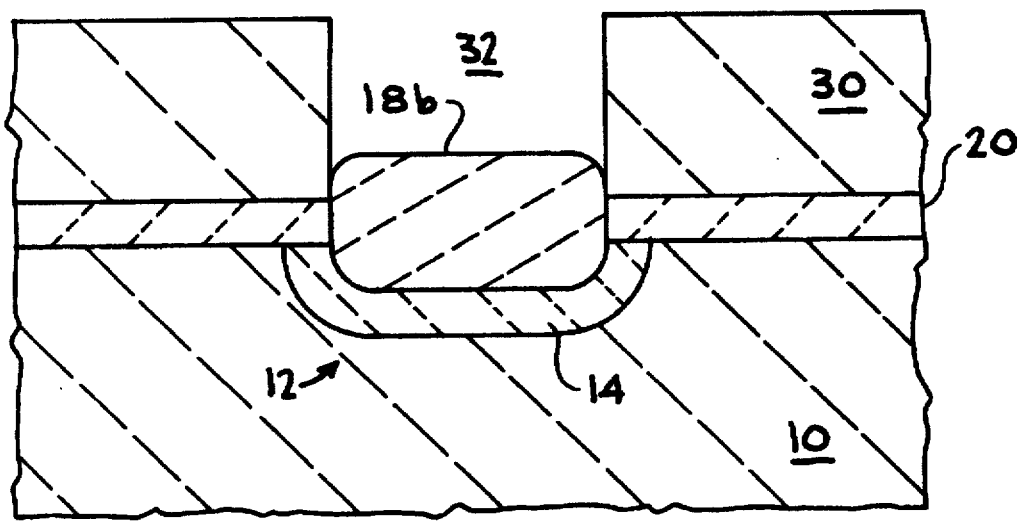
FIG. 5 is a fragmentary vertical cross-sectional view of the etched substrate of FIG. 3 after deposition of further oxide over the dense oxide grown in the implanted region of the substrate.
Figure 6:
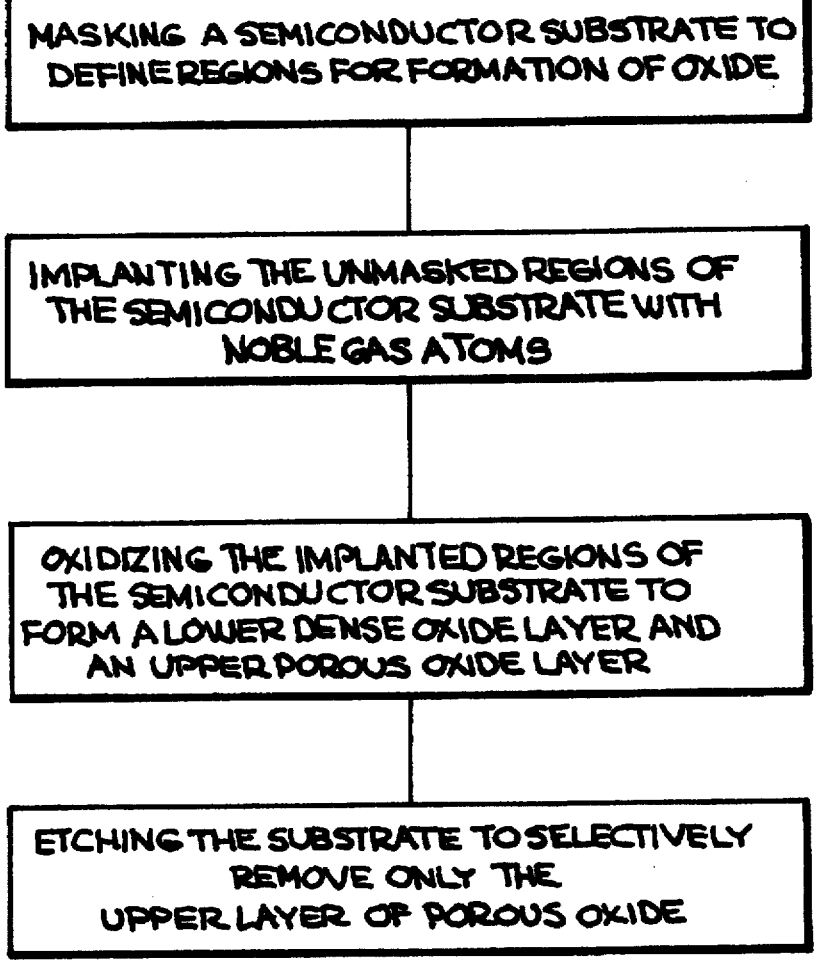
FIG. 6 is a flow sheet illustrating the process of the invention.

Alternatively, an oxide 18b may be deposited over dense oxide portion 14, partially filling mask opening 32 as well, as shown in FIG. 5, such as an oxide formed by CVD, using tetraethylorthosilicate (TEOS) and a gaseous source of oxygen.

The Implantation Step

The implantation of the semiconductor substrate prior to oxidation thereof is carried out using atoms of a noble gas, in a dosage preselected to be sufficient to locally amorphize the substrate. The term "noble gas", as used herein, is intended to include neon, argon, krypton, and xenon. While helium is also a noble gas, it has been omitted from the definition because it is too light to provide the desired amorphization of the substrate at a reasonable dosage level, and radon has been omitted because of its radioactivity.

The dosage and energy level to be used for the implantation will depend upon the particular noble gas species implanted into the substrate. Thus, the use of neon atoms instead of argon will result in the need for a higher necessary dosage and a lower implantation energy, due to the lighter atomic weight of neon. The use of the higher atomic weight krypton or xenon atoms, instead of argon, conversely, will result in a lowering of the dosage range, but at a higher implantation energy, to arrive at an equivalent distribution of implanted noble gas ions in the substrate and an equivalent effect on the crystal lattice system of the substrate.

To achieve the desired formation of a lower oxide layer of higher density and an upper porous or frothy oxide layer, it is important to control both the dosage and implantation energy levels. It has been found, for example, that an argon implantation at a dosage of $8.5 \times 10^{16}$ ions/cm$^2$ and an implantation energy of about 150 KeV can result in a complete reversal of the oxide layers, i.e., when the implanted silicon substrate is subsequently oxidized, the porous or frothy oxide layer is formed first and the more dense oxide layer is formed over the porous oxide layer.

Thus, the maximum dosage and energy levels to be used during the implantation carried out in accordance with the invention are those dosage and energy levels which will result in the subsequent formation, during an oxidation step, of a lower, more dense, oxide layer, and an upper porous oxide layer in the silicon substrate. By use of the term "dense oxide layer" is meant an oxide having a density approximating that of a thermally grown oxide, whereas the term "porous oxide" is intended to define an oxide layer having a density of at least 25% less than that of a conventional thermal oxide.

Therefore, the maximum dosage level and implantation energy level, expressed as equivalents to that used for the implantation of argon ions, may be stated as an "equivalent dosage" of less than about $8.5 \times 10^{16}$ ions/cm$^2$, and an "equivalent implantation energy level" of less than about 150 KeV. Preferably the equivalent dosage should not exceed about $8 \times 10^{16}$ ions/cm$^2$ and the equivalent implantation energy should not exceed about 140 KeV. More preferably, the equivalent dosage should not exceed about $7 \times 10^{16}$ ions/cm$^2$ and the equivalent implantation energy should not exceed about 120 KeV, and most preferably the equivalent dosage should not exceed about $6 \times 10^{16}$ ions/cm$^2$ and the equivalent implantation energy should not exceed about 100 KeV. It will, of course, be appreciated that within equivalent dosage and equivalent implantation energy levels not exceeding the above recited maximum levels, the depth of the implantation and resultant total thickness of the subsequently dense and porous oxide layers can be controlled by variations in the dosage levels and commensurate variations in the implantation energies.

With respect to the minimum equivalent dosage level and the minimum equivalent implantation energy level, the minimum implantation energy will be governed by the desired depth of the implantation which, in turn, will govern the thickness of the of dense oxide/porous oxide subsequently formed during the oxidation step. The minimum dosage will be governed by the need to achieve amorphization of the silicon substrate lattice. This minimum dosage for argon, for example, would be about $5 \times 10^{14}$ ions/cm$^2$.

It should be noted that the effect of forming the more dense oxide as the upper layer, and the porous oxide as the lower layer, (e.g., if the equivalent dosage is at a level equal to or higher than about $8.5 \times 10^{16}$ ions/era$^2$, and the equivalent implantation energy level is at a level equal to or higher than about 150 KeV) may also be useful, for example, for the accurate removal of silicon from the silicon substrate, such as to consume silicon for the formation of trench-like structures in the silicon substrate.

During the implantation, the thickness of mask layer 20 should be sufficient to screen the implanted species from the silicon substrate. When argon is being implanted and the mask is formed of silicon nitride, the mask thickness should be at least about 3000 Angstroms to ensure that only the unmasked portions of substrate 10 are implanted with the particular noble gas atoms. While nitride is a preferred mask material (for mask thicknesses in this range), instead of, for example, a photoresist mask, it should be noted that in some instances other masking materials may be used, particularly if a thinner mask can be successfully used.

The Oxidation Step

After implantation of the unmasked portions of the substrate with the noble gas atoms, the implanted substrate is oxidized, preferably by a wet atmosphere such as steam, although other oxidation methods could be used such as, for example, exposure to oxygen gas alone, or a mixture of 1,1,1-trichloroethane vapors and oxygen gas.

In accordance with the invention, it has been found that in contrast to of conventional thermal oxide formation, such a thermal oxidation may be carried out at a temperature from about 750° C. up to less than about 900° C., resulting in the formation of oxide in the silicon substrate to a depth corresponding to the implanted region of the substrate, i.e., the substrate region containing about 80–90% of the implanted species. Furthermore, it has been found that the formation of oxide in this implanted region, i.e., the extent of the oxidation of the implanted portion of the substrate, seems to be independent of temperature in this range of about 800–900° C., and the oxidation (of the implanted region of the substrate) also seems to proceed at a rate higher than normal thermal oxide rates, which are normally carried out at higher temperatures.

Figure 7A:
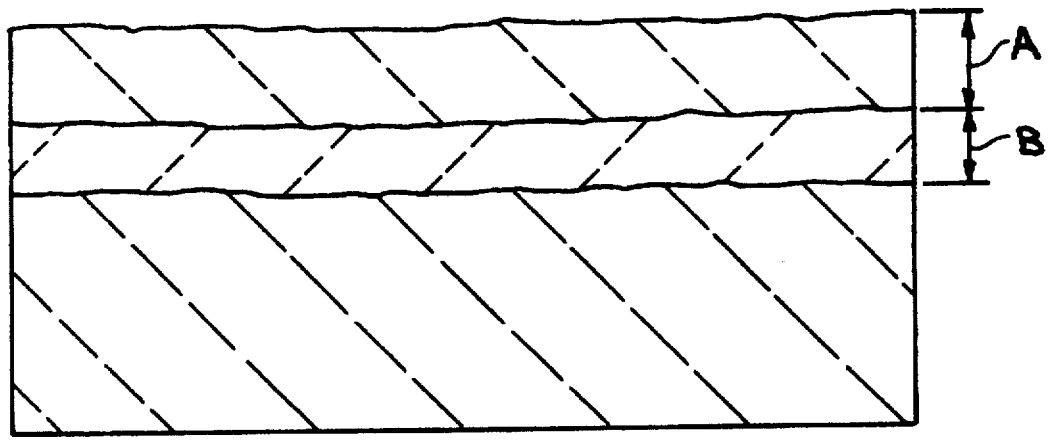
FIGS. 7A and 7B are photographs taken by Scanning Electron Microscope (SEM) of the oxide grown in the implanted region of the substrate respectively at 850° C. and 900° C., showing the similarity of thickness of the resulting oxide layers grown at the two different temperatures.
Figure 7B:
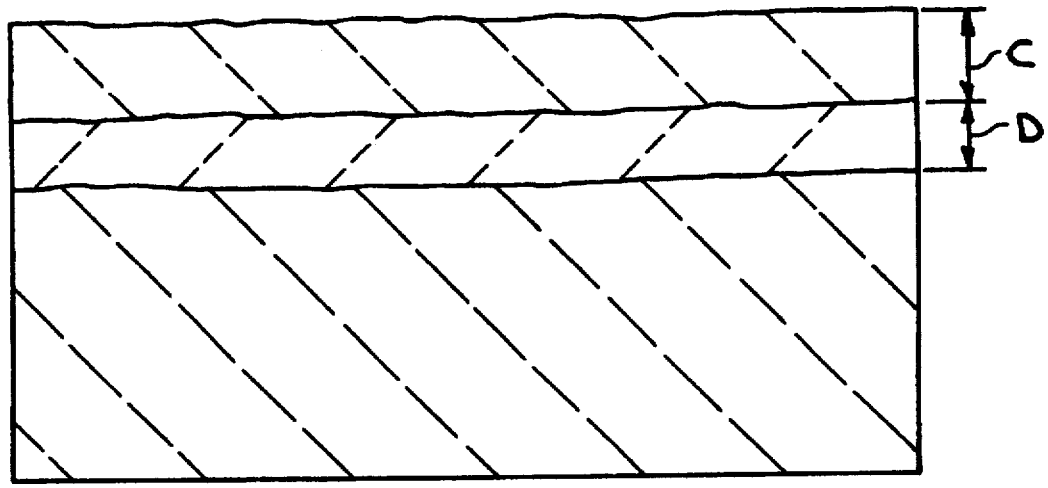

Thus, temperatures of 900° C. or higher have been found to be unnecessary to obtain the desired oxidation of the implanted region of the silicon substrate. In a preferred embodiment, the oxidation is carried out at a temperature of about 825° C. to about 875° C., typically about 850° C. It has been found, for example, that oxide form at 850° C. results in the formation of the previously described dual oxide structure, with each layer having substantially the same total thickness as when the oxidation is carried out at 900° C. This is illustrated in FIGS. 7A and 7B, wherein the thickness of each of the dual oxide layers formed at 850° C. and illustrated in FIG. 7A (respectively at A and B), will be seen to be substantially the same as the thickness of each of the dual oxide layers formed at 900° C. and illustrated in FIG. 7B (respectively at C and D).

While we do not wish to be bound by any theories of how the oxide is formed, it appears that oxide formation at lower temperatures is favored in those regions of the substrate previously implanted by the noble gas atoms and thus an increase in oxidation time or temperature does not result in a corresponding increase in the thickness of the oxide layer, as would be expected in conventional oxidation processes. As a result, lower oxidation temperatures may be used in the process of the invention, resulting in thermal savings. Furthermore, apparently the dual oxide structure is formed as a direct result of the noble gas implantation, due to the implanted noble gas atoms not only causing local amorphizing of the crystalline lattice, but also producing gas-filled pockets of the noble gas wherein the gas is under tremendous pressure, apparently because the noble gas cannot be incorporated into the single crystal substrate structure and solid solubility is greatly exceeded. When the equivalent dosage level and implantation energy ranges previously discussed are used, the first or upper oxide layer formed then is extremely porous and frothy presumably because of the almost explosive release of the pockets of noble gas trapped in the substrate. This frothy oxide extends in depth to about the center of the peak concentration region of the implanted noble gas species. However, damage (amorphizing) extends beyond this point. The oxidation process apparently displaces the implanted noble gas atoms, and the resulting compressive forces present operate to densify the lower oxide layer formed in the implanted region of the substrate.

The Etching Step

In accordance with the invention, the previously formed frothy porous upper layer of oxide may be selectively removed, thereby leaving the dense oxide portion remaining in the substrate. This selective removal of the less dense upper layer of oxide may be carried out using any conventional oxide etch system, including either a dry etch or a wet etch. For example, a mild etching procedure may be used comprising an exposure of the oxidized substrate for about 3 seconds to a solution of Sirlt's etch (which is a 1:1 mixture of HF acid (49%) and five molar chromic acid) at room temperature.

Formalation of Further Oxide over the Removing Dense Oxide

After removal of the porous layer of oxide formed in the implanted region of the substrate, further oxide 18a may be grown in the implanted region of the substrate beneath remaining dense oxide layer 14, as shown in FIG. 4. Such further oxide, for example, may be grown using conventional wet atmosphere conditions such as any conventional steam atmosphere process. For example, the further oxide may be grown beneath the remaining dense oxide layer by exposing the still masked substrate to steam.

Alternatively, further oxide 18b may be deposited over dense oxide layer 14 remaining in the implanted region of the substrate after the etching step by any conventional oxide deposition process, such as a conventional CVD-formed oxide process using TEOS and a source of oxygen, as is well known to those skilled in the art. In such case, oxide 18b may be deposited to a thickness which will at least partially fill mask opening 32 in nitride mask 30 and underlying oxide layer 20, resulting in the structure shown in FIG. 5

To further illustrate the process Argon was implanted into a number of silicon wafers at a dose level of $5 \times 10^{16}$ argon atoms/$^2$ and an energy level of 80 KeV. Some of the implanted wafers and some unimplanted control wafers were then subject to wet oxidation in steam for 60 minutes at 900° C. Another set of implanted wafers was also subject to the wet oxidation in steam for 60 minutes, but at a temperature of 850° C. Each set of wafers was then shadow masked and aluminum dots were formed over the oxide to permit measurement of the oxide breakdown voltages of the respective wafers. The breakdown voltages for each of the implanted wafers was higher than that of the unimplanted control, signifying the presence of additional oxide formed on the implanted wafers.

High resolution Scanning Electron Microscopy (SEM) was performed respectively on the implanted wafers oxidized at both 850° C. and at 900° C. In each case, an upper frothy oxide layer was formed which extended down to the center of the region of peak concentration of the implanted noble gas atoms. There was a sharp line of demarcation between this upper frothy oxide layer and a dense oxide lower layer. The layers of oxide formed in the wafers oxidized at 850° C. were the same thickness as the respective oxide layers formed in the wafers oxidized at 900° C. to within 10%. The frothy upper oxide layer averaged about 0.19 micrometer (μm) in thickness, while the thickness of the dense lower oxide layer averaged about 0.13 μm in thickness. The composition of both layers were probed by Auger analysis and found to be oxides in all cases.

Thus, the invention provides a process for forming a dense oxide region at a substantial depth in a semiconductor substrate at a low temperature, using a noble gas atom implantation, which can be useful in the subsequent formation of an isolation oxide region between adjacent active regions in the substrate. Implantation of the substrate with noble gas atoms appears to direct the subsequent oxidation of the substrate toward the implanted regions of the substrate to form a dual layer of oxide having a thickness which is relatively independent of the oxidation temperature, at least between temperatures from about 850° C. to about 900° C. The upper frothy layer of oxide is easily removed selectively, leaving a dense layer of oxide in the substrate at a depth substantially deeper than would normally be attained under thermal oxide conditions within the same temperature range, i.e. at a temperature of 900° C. or less. The noble gas atoms remaining in the substrate surrounding the oxidized regions, after implantation and oxidation, may act to reduce carrier lifetimes which can inhibit the creation of a parasitic isolation transistor. Furthermore, segregation of dopant species such as boron into the oxide may be reduced by the presence of the noble gas atoms resulting in a more controllable field threshold.

Having thus described the invention what is claimed is:

1. A process for forming dual layers of oxide comprising a dense oxide layer and a porous oxide layer on a semiconductor substrate which comprises:
   a) implanting said substrate with a noble gas:
      1) to an equivalent dosage level range of from $5 \times 10^{14}$ ions/cm$^2$ to less than $8.5 \times 10^{16}$ ions/cm$^2$; and
      2) using an equivalent energy level of less than about 150 KeV; said dosage level range and said energy level of said noble gas implantation being sufficient to provide a doped region in said substrate which will oxidize to form said dual layers of oxide comprising a lower dense oxide layer and an upper porous oxide layer upon subsequent oxidation of said implanted substrate;
   b) oxidizing said implanted substrate to form said dual layers of oxide; and
   c) etching said oxidized substrate to remove said upper porous oxide layer.

2. The process of claim 1 including the further step of masking said substrate prior to said implantation step.

3. The process of claim 2 wherein said step of implanting said substrate with a noble gas further comprises implanting an equivalent dosage level of noble gas ions not exceeding about $8 \times 10^{16}$ ions/cm$^2$ at an equivalent energy level not exceeding 140 KeV.

4. The process of claim 3 wherein said step of implanting said substrate with a noble gas further comprises implanting an equivalent dosage level of noble gas ions not exceeding about $7 \times 10^{16}$ ions/cm$^2$ at an equivalent energy level not exceeding 120 KeV.

5. The process of claim 4 wherein said step of implanting said substrate with a noble gas further comprises implanting an equivalent dosage level of noble gas ions not exceeding about $6 \times 10^{16}$ ions/cm$^2$ at an equivalent energy level not exceeding 100 KeV.

6. The process of claim 2 wherein said step of implanting said substrate with a noble gas further comprises implanting a noble gas selected from the group consisting of neon, argon, krypton, and xenon.

7. The process of claim 6 wherein said step of implanting said substrate with a noble gas further comprises implanting said substrate with argon.

8. The process of claim 1 wherein said step of oxidizing said implanted substrate further comprises oxidizing said substrate in a wet atmosphere.

9. The process of claim 8 wherein said step of oxidizing said implanted substrate further comprises oxidizing said substrate in steam.

10. The process of claim 9 wherein said step of oxidizing said implanted substrate in steam further comprises oxidizing said substrate in steam at a temperature of at least about 750° C.

11. The process of claim 1 wherein said step of etching said substrate to remove a portion of said oxide further comprises dry etching said substrate to remove a portion of said oxide.

12. The process of claim 1 wherein said step of etching said substrate to remove a portion of said oxide further comprises wet etching said substrate to remove a portion of said oxide.

13. The process of claim 1 wherein said step of oxidizing said implanted substrate further comprises forming two layers of oxide in said substrate; and said step of etching said oxidized substrate to remove a portion of said oxide further comprises etching said oxidized substrate to remove substantially all of the upper layer of said oxide.

14. The process of claim 13 wherein said step of oxidizing said implanted substrate to form two layers of oxide in said substrate further comprises forming a lower layer of dense oxide and an upper layer of less dense oxide over said layer of dense oxide; and said step of etching said oxidized substrate to remove a portion of said oxide further comprises etching said oxidized substrate to remove substantially all of said less dense upper layer of oxide.

15. The process of claim 14 wherein said process comprises the further step of forming additional oxide adjacent said dense oxide layer remaining in said substrate after said etching step.

16. The process of claim 15 wherein said step of forming additional oxide on said substrate adjacent said dense oxide layer after said etching step comprises growing additional oxide on said substrate by exposing said substrate to a wet atmosphere.

17. The process of claim 15 wherein said step of forming additional oxide on said substrate adjacent said dense oxide layer after said etching step comprises depositing additional oxide on said dense oxide layer on said substrate.

18. The process of claim 17 wherein said substrate is silicon and said step of depositing additional oxide on said substrate over said dense oxide layer after said etching step further comprises depositing additional oxide on said substrate using tetraethylorthosilicate (TEOS) and a source of oxygen.

19. A low temperature process for forming isolation oxide on a semiconductor substrate by forming dual layers of oxide on said substrate comprising a lower dense oxide layer and an upper porous oxide layer which comprises:
   a) masking said substrate;
   b) implanting unmasked portions of said substrate with a noble gas:
      i) selected from the group consisting of neon, argon, krypton, and xenon;
      ii) at a dosage equivalent to an argon implantation dosage within a range of from about $8 \times 10^{16}$ ions/cm$^2$ to about $5 \times 10^{14}$ ions/cm$_2$; and
      iii) at an energy level equivalent to an argon implantation energy level at least sufficient to provide a doped region in said substrate capable of subsequently oxidizing to form said dual layers of oxide, but not exceeding about 140 KeV;

said dosage level range and said energy level of said noble gas implantation being sufficient to provide a doped region in said substrate capable of oxidizing at a temperature not exceeding 900° C. to form said dual layers of oxide comprising said lower dense oxide layer and said upper porous oxide layer upon subsequent oxidation of said implanted substrate;
   c) then oxidizing said implanted substrate in a wet atmosphere of steam at a temperature of at least about 750° C. to about 900° C.;
   d) then etching said oxidized substrate to remove a portion of said oxide; and
   e) then optionally forming a further layer of oxide contiguous with said remaining lower dense layer of oxide to form said isolation oxide.

20. The process of claim 19 wherein said step of oxidizing said implanted substrate further comprises forming two layers of oxide in said substrate; and said step of etching said oxidized substrate to remove a portion of said oxide further comprises etching said oxidized substrate to remove substantially all of the upper layer of said oxide.

21. The process of claim 20 wherein said step of oxidizing said implanted substrate to form two layers of oxide in said substrate further comprises forming a lower layer of dense oxide and an upper layer of less dense oxide over said layer of dense oxide; and said step of etching said oxidized substrate to remove a portion of said oxide further comprises etching said oxidized substrate to remove substantially all of said less dense upper layer of oxide.

22. The process of claim 21 wherein said process comprises the further step of forming additional oxide on said substrate adjacent said dense oxide layer after said etching step.

23. The process of claim 22 wherein said step of forming additional oxide on said substrate adjacent said dense oxide layer after said etching step comprises growing additional oxide on said substrate by exposing said substrate to a wet atmosphere.

24. The process of claim 22 wherein said step of forming additional oxide on said substrate adjacent said dense oxide layer after said etching step comprises depositing additional oxide on said dense oxide layer on said substrate.

* * * * *